United States Patent

Nishimoto et al.

[11] Patent Number: 5,455,182
[45] Date of Patent: Oct. 3, 1995

[54] SEMICONDUCTOR PROCESS FOR FORMING CHANNEL LAYER WITH PASSIVATED COVERING

[75] Inventors: Yoshihiro Nishimoto, Osaka; Yoshifumi Kishida, Shiki, both of Japan

[73] Assignee: Sharp Kabushiki Kaisha, Japan

[21] Appl. No.: 62,729

[22] Filed: May 18, 1993

Related U.S. Application Data

[63] Continuation of Ser. No. 741,351, Aug. 7, 1991, abandoned.

[30] Foreign Application Priority Data

Nov. 2, 1990 [JP] Japan ......................... 2-298569

[51] Int. Cl.⁶ ................................. H01L 21/84
[52] U.S. Cl. ................ 437/21; 437/40; 437/101; 437/909; 437/968
[58] Field of Search ............. 437/40, 909, 101, 437/41, 21, 968

[56] References Cited

U.S. PATENT DOCUMENTS 4,814,292  3/1989  Sasaki et al. .................. 437/101
5,047,819  9/1991  Tanaka et al. .................. 257/390

FOREIGN PATENT DOCUMENTS

| 1591436 | 11/1969 | Denmark ...................... 357/4 |
| 60-94778A | 5/1985 | Japan . |
| 42961 | 3/1986 | Japan ......................... 357/4 |
| 90859 | 4/1988 | Japan ......................... 357/4 |
| 2077039A | 12/1981 | United Kingdom . |
| 2077039 | 12/1981 | United Kingdom ................ 357/4 |

Primary Examiner—Olik Chaudhuri
Assistant Examiner—Richard A. Booth
Attorney, Agent, or Firm—Nixon & Vanderhye

[57] ABSTRACT

A thin film transistor which includes a first insulating layer, a silicon channel layer formed on the first insulating layer, and a second insulating layer formed on the silicon channel layer, and a passivation layer formed on the first insulating layer and formed successive to and covering the side face of the channel layer between the first and second insulating layers.

19 Claims, 3 Drawing Sheets

SEMICONDUCTOR PROCESS FOR FORMING CHANNEL LAYER WITH PASSIVATED COVERING

This is a continuation of application Ser. No. 07/741,351, filed Aug. 7, 1991, now abandoned.

BACKGROUND OF THE INVENTION

1. Field of the Invention

The present invention relates to a thin film transistor used in a display panel such as a liquid crystal display panel, and a process for fabricating the same. In this specification, the thin film transistor will be referred to as "TFT".

2. Description of the Prior Art

FIGS. 7a and 7b, and FIGS. 8a and 8b show a known process for fabricating a TFT which use amorphous silicon used for a liquid crystal display panel. FIGS. 7b and 8b are respectively cross-sectional views of FIGS. 7a and 8a, taken along the line B—B. The TFT is fabricated as follows:

Tantalum is deposited on the whole surface of a glass substrate 1 by sputtering. A gate bus line 2 is formed by patterning the Ta layer. Anodic oxidization is performed on the upper surface of the gate bus line 2 to form an anodic oxide layer 3. Then, a gate insulating layer 4 of $SiN_x$, a semiconductor layer 15 of intrinsic semiconductor amorphous silicon (hereinafter referred to as "a-Si(i)") which later becomes a channel layer 5 for the TFT, and a second $SiN_x$ layer which later becomes a protective back layer 6 are successively layered by a CVD method. In addition, a photoresist mask 7 is formed by patterning a first photoresist formed on the second $SiN_x$ layer. Then, a semiconductor layer 15 is etched using the protective back layer 6 as an etching mask to form the channel layer 5 (FIG. 8a and 8b).

Finally, the whole surface of the substrate 1 including the protective back layer 6 is covered with an insulating layer such as $SiN_x$, and the usual procedure is pursued to form a TFT.

The TFT fabricated by the above-mentioned process has the following disadvantages:

When the channel layer 5 is to be patterned, the side face thereof is exposed between the gate insulating layer 4 and the protective back layer 6, thereby allowing foreign materials to be stuck to the exposed side face. The failure to remove such foreign materials is likely to cause problems. In addition, when the channel layer 5 is formed by etching using the protective back layer 6 as the etching mask in a liquid, the channel layer 5 is often excessively etched, thereby causing the protective back layer 6 to extend over the channel layer 5 like eaves as shown in FIG. 8b. In this case, the side face of the channel layer 5 is exposed under the eaves between the gate insulating layer 4 and the protective back layer 6, so that it is more difficult to remove the foreign materials adhered to the exposed side face.

In order to avoid forming the detrimental eaves, one way is to remove the protective back layer 6 after the channel layer 5 is formed, and then to pattern the insulating layer. However, because the channel layer 5 is only a few hundreds angstroms thin that the removal of the protective back layer 6 and the subsequent cleaning are likely to unfavorably affect the channel layer 5. The adherence of foreign matters to the exposed channel layer 5 per se is a problem.

If the TFT is fabricated with the foreign materials adhering to the channel layer 5, the foreign materials are likely to react with the a-Si(i) component of the channel layer 5, and cause various problems such as an electrical short circuit between the source electrode and the drain electrode of the TFT, a low yield of the TFT production such as reduced conductivity, and inconsistent electrical characteristics of the TFT.

SUMMARY OF THE INVENTION

The thin film transistor of this invention, which overcomes the above-discussed and numerous other disadvantages and deficiencies of the prior art, comprises a first insulating layer, a silicon channel layer formed on the first insulating layer, and a second insulating layer formed on the silicon channel layer, and a passivation layer formed on the first insulating layer and formed successive to and covering the side face of the channel layer between the first and second insulating layers.

In a preferred embodiment, the silicon channel layer is made of amorphous silicon.

In a preferred embodiment, the silicon channel layer is made of polycrystal silicon.

In a preferred embodiment, the silicon channel layer is made of monocrystal silicon.

According to another aspect of the present invention, there is provided a process for fabricating a thin film transistor layer comprising the steps of preparing a first insulating layer, forming a semiconductor layer on the first insulating layer with silicon, forming a second insulating layer on the semiconductor layer by patterning, and oxidizing the semiconductor layer by use of the second insulating layer as a mask to form a channel layer positioned below the second insulating layer and a passivation layer formed successive to and covering the side face of the channel layer.

In a preferred embodiment, the silicon is amorphous silicon.

In a preferred embodiment, the silicon is polycrystal silicon.

In a preferred embodiment, the silicon is monocrystal silicon.

Thus, the invention described herein makes possible the objectives of (1) providing TFTs having a passivation layer formed successive to and covering the side face of the channel layer, thereby protecting the side face thereof from impurities or foreign matter, and (2) providing a process of fabricating TFTs in which the side face of the channel layer is protected from impurities or foreign matter.

BRIEF DESCRIPTION OF THE DRAWINGS

This invention may be better understood and its numerous objects and advantages will become apparent to those skilled in the art by reference to the accompanying drawings as follows:

FIGS. 1a to 6a are plan views showing a manufacturing process of a thin film transistor of the present invention;

FIGS. 1b to 6b are respectively cross-sectional views of FIGS. 1a to 6a, taken along line B—B;

DESCRIPTION OF THE PREFERRED EMBODIMENTS

Figure 1A:
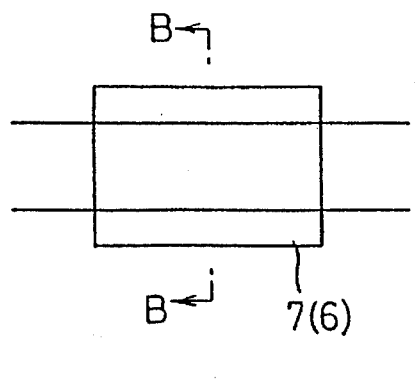
Figure 1B:
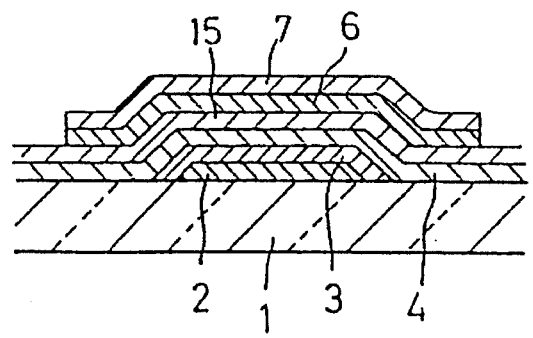

Referring to FIGS. 1a to 6a, a glass substrate 1 is prepared, and Ta is deposited on the whole surface of the substrate 1 by sputtering. A gate electrode 2 is formed by patterning the Ta layer. Anodic oxidization is performed on the upper surface of the gate electrode 2 to form an anodic oxide layer 3. Then, three layers of a gate insulating layer 4 made of $SiN_x$, a semiconductor layer 15 of intrinsic semiconductor amorphous silicon (hereafter referred to as "a-Si(i)") which later becomes a channel layer 5 of the TFT and a second $SiN_x$ layer, which later becomes a protective back layer 6, are successively grown by a plasma CVD method. Then, a photoresist mask 7 is formed by patterning a first photoresist on the second $SiN_x$ layer. As the next step, the second $SiN_x$ layer is patterned to form the protective back layer 6 for a second insulating layer by using the photoresist mask 7 as an etching mask as shown in FIGS. 1a and 1b.

Figure 2A:
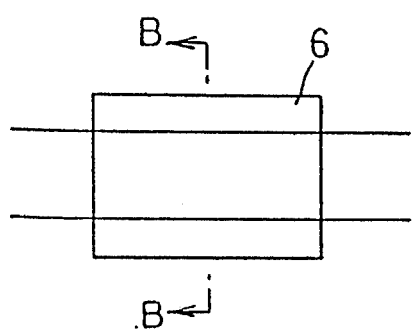
Figure 2B:
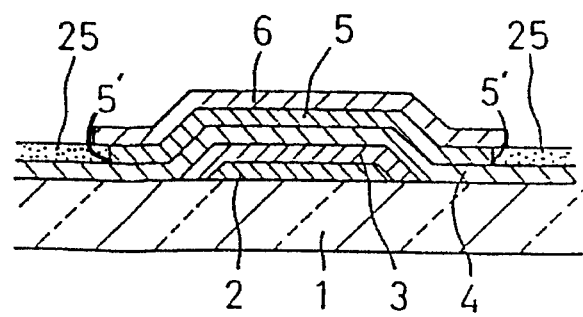

Then, the anodic oxidization is performed on the semiconductor layer 15 by using the protective back layer 6 as a mask. The anodic oxidization is conducted under the conditions known in the art. In this example, an electrolytic solution of ammonia nitrate dissolved in THFA (tetrahydro furfuryl alcohol) by 0.04 normal is used. As shown in FIG. 2b, the anodic oxidization left unreactive a-Si(i) component of the semiconductor layer 15 as a channel layer 5. The anodic oxidized portion of the semiconductor layer 15 is formed into a passivation layer 25 made of $SiN_x$, whereby the channel layer 5 and the passivation layer 25 are formed as successive layers, thereby preventing the side face 5' of the channel layer 5 from being exposed.

The passivation layer 25, which is formed from the same silicon layer 15 which became the silicon channel layer 5, thus forms an edge portion of the silicon channel layer 5. The passivation edge portion 25 thus surrounds faces 5' (see FIGS. 2b, 3a, and 3b) of the silicon channel layer 5, with the result that the silicon channel layer 5 is surrounded by passivated edge portion 25.

Then, in order to enhance the quality of the passivation layer 25, a thermal treatment is conducted at temperatures of 200° C. to 300° C. The thermal treatment is not necessarily needed at this stage, but can be done at any time after the passivation layer 25 is formed.

Figure 3A:
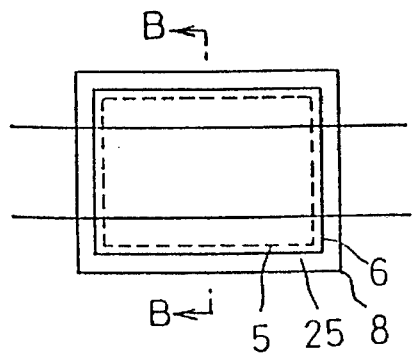
Figure 3B:
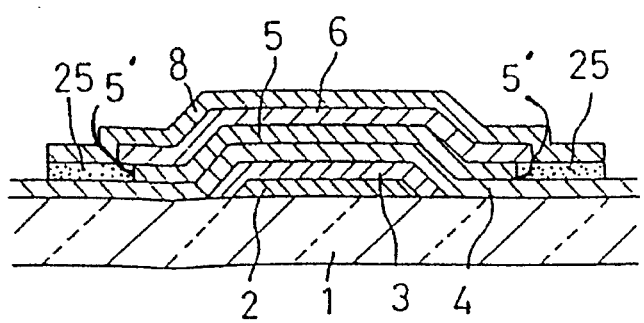

Subsequently, a photoresist is formed on the whole surface of the substrate 1 containing the passivation layer 25 and the protective back layer 6, and a photoresist mask 8 is patterned. As shown in FIGS. 3a and 3b, the passivation layer 25 is trimmed by removing the portion other than the peripheral zone around the channel layer 5 by use of the photoresist mask 8. Thus, the light permeability at the portion outside the TFT is enhanced and stress is reduced, otherwise stress would result from the passivation layer covering the whole surface. However, the patterning of the passivation layer 25 is not essential.

Figure 4A:
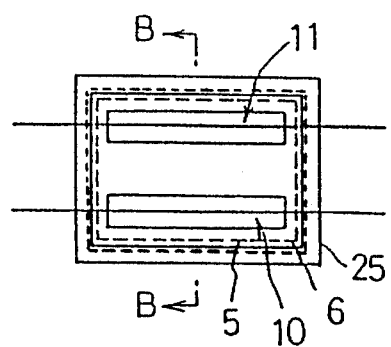
Figure 4B:
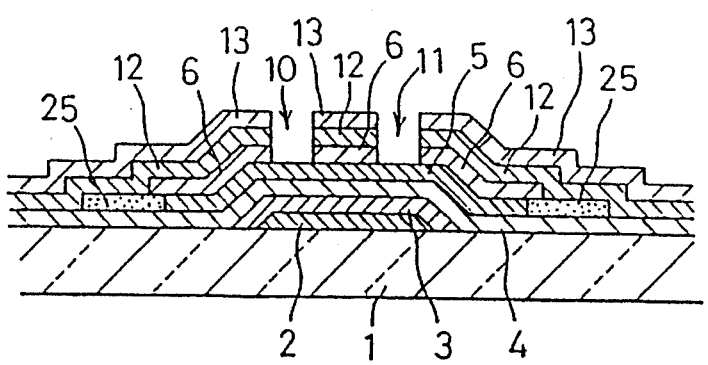

Then, an insulating layer 12 made of $SiN_x$ is formed over the whole surface of the substrate 1 by the plasma CVD method, and a photoresist is formed thereon. The photoresist is patterned to form a photoresist mask 13 as shown in the FIG. 4b. By using the photoresist mask 13, openings 10 and 11 are formed so as to connect the source electrode and the drain electrode of the TFT. As shown in FIG. 4b, the openings 10 and 11 penetrate the protective back layer 6 and the insulating layer 12. At this stage, the channel layer 5 is temporarily exposed but it does not unfavorably affect the electrical characteristics of the TFT when the ohmic contact is removed.

Figure 5A:
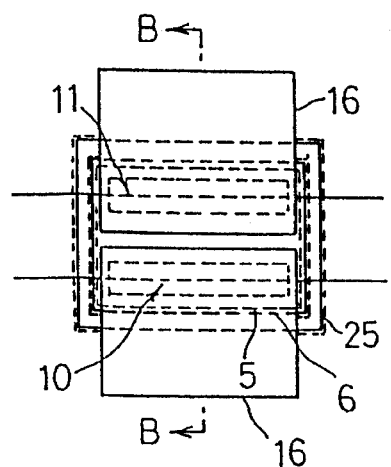
Figure 5B:
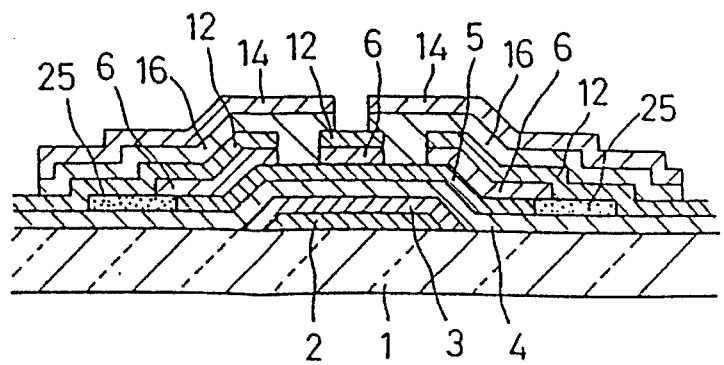
Figure 6A:
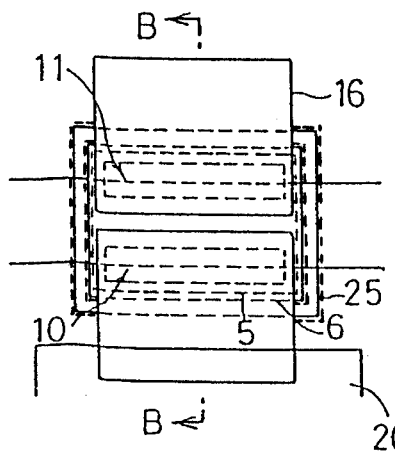
Figure 6B:
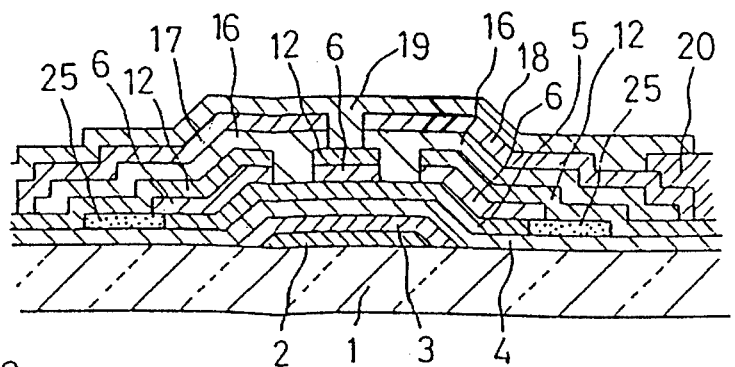
Figure 7A:
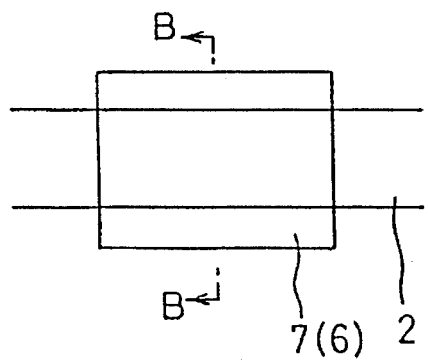
FIGS. 7a and 8a are plan views showing a manufacturing process of a thin film transistor in the prior art.
Figure 7B:
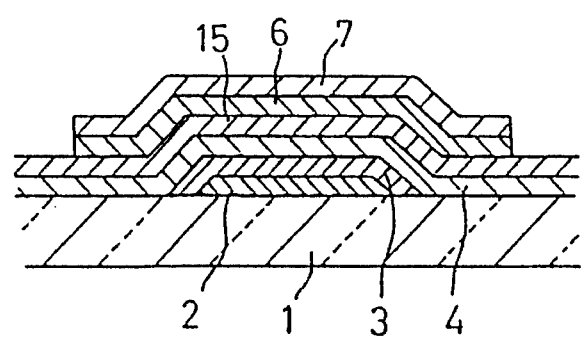
FIGS. 7b and 8b are respectively cross-sectional views of FIGS. 7a and 8a, taken along line B—B.
Figure 8A:
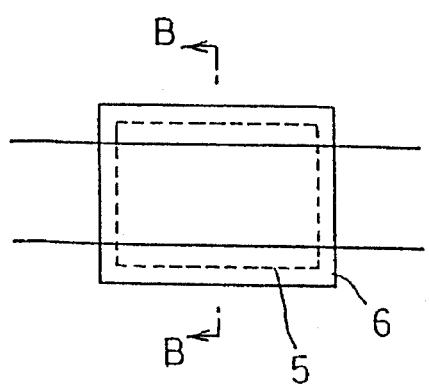
Figure 8B:
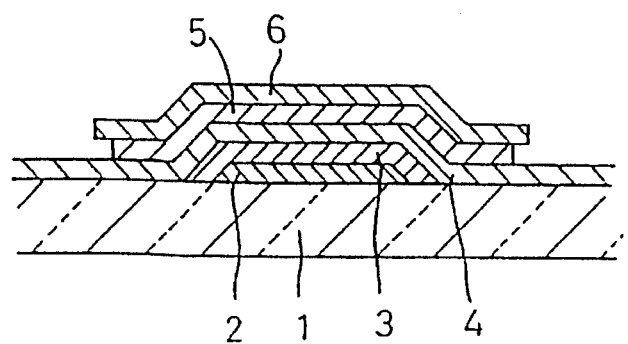

Then, $n^+$ type a-Si is deposited on the whole surface of the substrate 1, and is patterned by using a photoresist mask 14 to form contact layers 16 (FIGS. 5a and 5b). Then, a titanium layer is formed on the whole surface of the substrate 1 and patterned by a photolithography method and etching so as to form a source electrode 17 and a drain electrode 18 (FIGS. 6a and 6b). In this way, the TFT of the present invention is fabricated.

When it is desired, the TFT is connected to the drain electrode 18 to form pixel electrodes 20 made of ITO (indium tin oxide). A protect cover 19 is formed over the region excluding the pixel electrodes 20, thereby forming an active matrix substrate shown in FIGS. 6a and 6b.

The TFT of the present invention includes the passivation layer 25 formed on the gate insulating layer 4. The passivation layer 25 succeeds to the side face of the channel layer 5 between the gate insulating layer 4 and the protective back layer 6, thereby covering the side face of the channel layer 5. According to the fabricating process of this example, the passivation layer 25 is formed by anodic-oxidizing the surrounding portion of the channel layer 5 which later becomes the channel layer 5, so that the channel layer 5 is formed without exposing the side face. Therefore, impurities or other foreign materials could not adhere to the side face of the channel layer 5.

In this example, the whole part of the semiconductor layer 15 except the part which later becomes the channel layer 5 is anodic oxidized. Instead of the entire surface, the surrounding part of the channel layer 5 can be anodic oxidized locally. In this example, a-Si(i) is used as the channel layer 5, but polycrystal silicon or monocrystal silicon can be used in the same manner. In this example, the passivation layer 25 is formed by anodic oxidizing the semiconductor layer 15, but other processes such as an oxygen ion injection method can be used.

As is evident from the foregoing, in the TFT of the present invention, the passivation layer is formed successive to the side face of the channel layer, thereby preventing the side face of the channel layer from being exposed. The TFTs according to the present invention have a high yield of production and have consistent electrical characteristics.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A process for fabricating a thin film transistor layer comprising the steps of:

preparing a first insulating layer, forming a semiconductor layer on the first insulating layer with silicon, forming a second insulating layer on the semiconductor layer by patterning, using the second insulating layer as a mask during an oxidation process to form a channel layer from a portion of the semiconductor layer which is positioned below the second insulating layer and oxidizing an unmasked portion of the semiconductor layer to form a passivation layer covering at least one side face of the channel layer;

retaining at least a portion of the second insulation layer over the channel layer; and forming at least one of a source electrode and a drain electrode over the second insulation layer.

2. A process according to claim 1, wherein the silicon is amorphous silicon.

3. A process according to claim 1, wherein the silicon is polycrystalline silicon.

4. A process according to claim 1, wherein the silicon is monocrystal silicon.

5. A process for fabricating a thin film transistor comprising the steps of:

preparing a first insulating layer;

forming a semiconductor layer on the first insulating layer with silicon;

forming a second insulating layer on the semiconductor layer by patterning so as to cover and protect at least a portion of the semiconductor layer;

using the second insulating layer as a mask during an oxidation process and oxidizing an unmasked portion of the semiconductor layer to form a passivation layer covering at least one side face of a channel layer;

retaining at least a portion of the second insulation layer over the channel layer; and forming at least one of a source electrode and a drain electrode over the second insulation layer.

6. A process according to claim 5, wherein the silicon is amorphous silicon.

7. A process according to claim 5, wherein the silicon is polycrystalline silicon.

8. A process according to claim 5, wherein the silicon is monocrystal silicon.

9. A thin transistor according to claim 1, further comprising forming a third insulating layer on the second insulating layer and under at least one of the source electrode and the drain electrode.

10. A process according to claim 1, wherein the second insulating layer has a shape which defines the shape of the channel layer.

11. A process according to claim 1, wherein the second insulating layer is formed of $SiN_x$.

12. A process according to claim 1, wherein the oxidation process is performed by anodization.

13. A process according to claim 1, wherein a further etching process is performed for removing a part of the passivation layer.

14. A process according to claim 1, wherein the passivation layer is continuous with the channel layer and constantly protects the channel layer during fabrication processes.

15. A process according to claim 5, wherein the second insulating layer has a shape which defines the shape of the channel layer.

16. A process according to claim 5, wherein the second insulating layer is formed of $SiN_x$.

17. A process according to claim 5, wherein the oxidation process is performed by anodization.

18. A process according to claim 5, wherein a further etching process is performed for removing a part of the passivation layer.

19. A process according to claim 5, wherein the passivation layer is continuous with the channel layer and constantly protects the channel layer during fabrication processes.

* * * * *